US010117349B2

(12) United States Patent
Sakai

(10) Patent No.: US 10,117,349 B2
(45) Date of Patent: Oct. 30, 2018

(54) VEHICLE-MOUNTED CIRCUIT BOARD HOLDER STRUCTURE

(71) Applicant: HARADA INDUSTRY CO., LTD., Tokyo (JP)

(72) Inventor: Tomonori Sakai, Tokyo (JP)

(73) Assignee: HARADA INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 14/914,491

(22) PCT Filed: Aug. 22, 2014

(86) PCT No.: PCT/JP2014/072004
§ 371 (c)(1),
(2) Date: Feb. 25, 2016

(87) PCT Pub. No.: WO2015/029901
PCT Pub. Date: Mar. 5, 2015

(65) Prior Publication Data
US 2016/0212875 A1 Jul. 21, 2016

(30) Foreign Application Priority Data

Aug. 26, 2013 (JP) ................................. 2013-174477

(51) Int. Cl.
*H05K 7/14* (2006.01)
*H01Q 1/12* (2006.01)
*H05K 5/00* (2006.01)

(52) U.S. Cl.
CPC ......... *H05K 7/1417* (2013.01); *H01Q 1/1271* (2013.01); *H05K 5/006* (2013.01)

(58) Field of Classification Search
CPC .. H05K 7/1417; H05K 7/1418; H05K 5/0026; H05K 5/0043; H05K 5/0047; H05K 5/006
See application file for complete search history.

(56) References Cited

U.S. PATENT DOCUMENTS 3,934,074 A * 1/1976 Evelove ............... H05K 1/0271
174/535
4,424,404 A * 1/1984 Moore ................. H05K 7/1417
174/564

(Continued)

FOREIGN PATENT DOCUMENTS

CN 2309688 Y 3/1999
JP 2003-332755 A 11/2003

(Continued)

OTHER PUBLICATIONS

International Search Report in PCT/JP2014/072004 dated Nov. 25, 2014.

(Continued)

*Primary Examiner* — Hoa C Nguyen
*Assistant Examiner* — Christopher L Augustin

(57) ABSTRACT

A vehicle-mounted circuit board holder structure includes: a circuit board configured to process a signal from an antenna element; a holding member configured to hold the circuit board so as to sandwich the circuit board from both sides of a mount surface; and a mold member covering the circuit board and at least part of the holding member.

20 Claims, 12 Drawing Sheets

(56) References Cited

U.S. PATENT DOCUMENTS

| | | | | | |
|---|---|---|---|---|---|
| 4,779,744 | A | * | 10/1988 | Shely | H05K 7/1418 211/41.17 |
| 5,009,311 | A | * | 4/1991 | Schenk | H05K 3/284 206/706 |
| 5,373,104 | A | * | 12/1994 | Brauer | H05K 7/1417 174/562 |
| 5,438,482 | A | * | 8/1995 | Nakamura | H04B 1/3816 174/371 |
| 5,644,101 | A | * | 7/1997 | Elliott | H04N 5/64 174/363 |
| 6,184,462 | B1 | * | 2/2001 | Bellur | H01H 9/0271 174/535 |
| 6,225,559 | B1 | * | 5/2001 | Hubner | H05K 7/1417 174/542 |
| 7,358,438 | B2 | * | 4/2008 | Zoller | B60R 16/0239 174/50 |
| 8,338,713 | B2 | * | 12/2012 | Fjelstad | H01R 12/523 174/251 |
| 2004/0127270 | A1 | * | 7/2004 | Wulff | H04B 1/3833 455/575.4 |
| 2005/0099228 | A1 | * | 5/2005 | Akatsuka | H01P 1/15 330/66 |
| 2007/0119792 | A1 | * | 5/2007 | Hendrix | H05K 7/1418 211/26 |
| 2010/0124034 | A1 | * | 5/2010 | Shouyama | H05K 1/02 361/756 |
| 2014/0071640 | A1 | * | 3/2014 | Imamoto | H05K 7/1461 361/752 |
| 2014/0104775 | A1 | * | 4/2014 | Clayton | G06F 1/184 361/679.31 |
| 2014/0168519 | A1 | * | 6/2014 | Imai | H04N 5/50 348/731 |

FOREIGN PATENT DOCUMENTS

| | | |
|---|---|---|
| JP | 2008-035479 A | 2/2008 |
| JP | 2008-072471 A | 3/2008 |
| JP | 2010-050886 A | 3/2010 |

OTHER PUBLICATIONS

International Preliminary Report on Patentability in the corresponding International Patent Application No. PCT/JP2014/072004 dated Mar. 1, 2016.

* cited by examiner

*Fig.3*
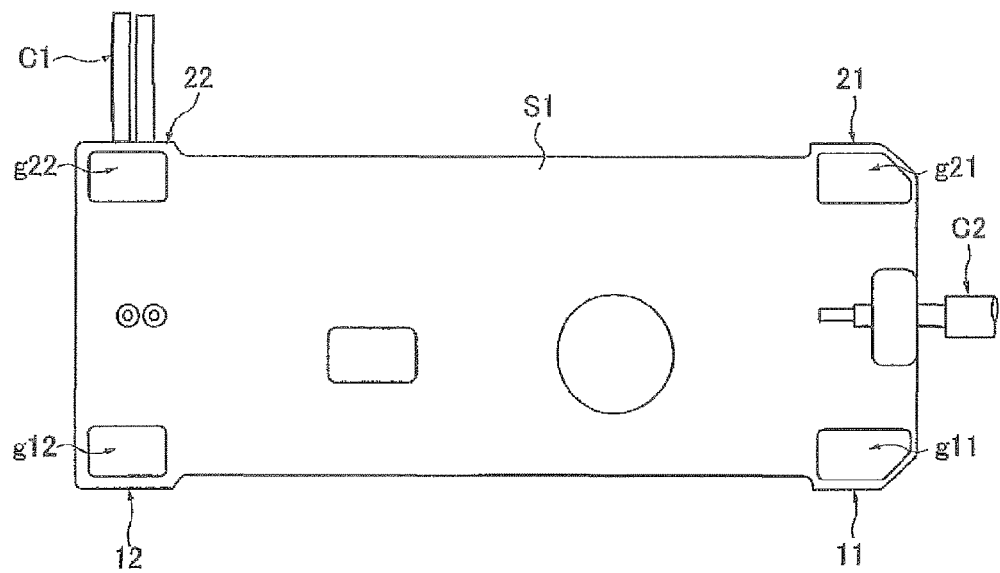
(a)
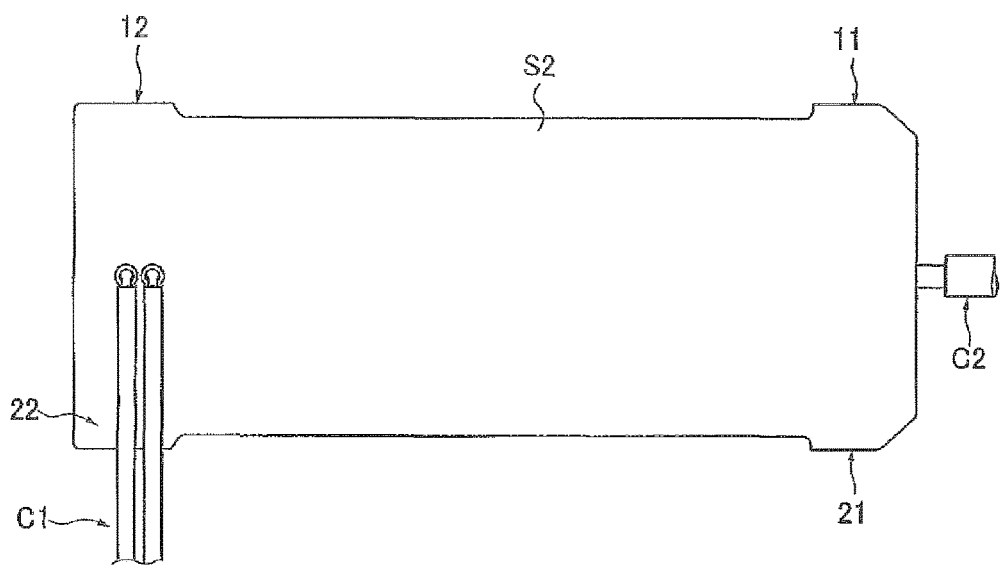
(b)

Fig.4
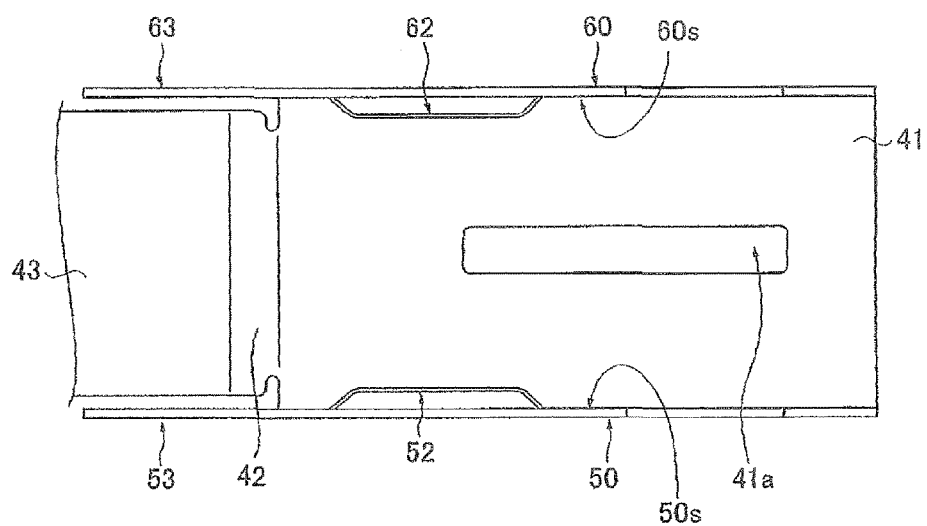
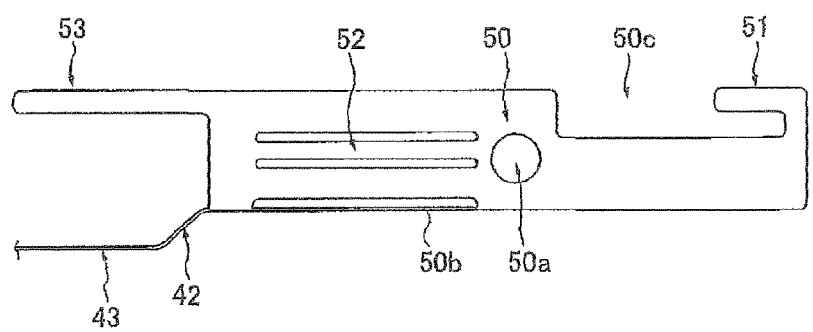

VIEWED FROM ARROW A

VEHICLE-MOUNTED CIRCUIT BOARD HOLDER STRUCTURE

TECHNICAL FIELD

The present invention relates to a technique related to a structure for holding a circuit board mounted on a vehicle, for example, such as a circuit board used for a vehicle-mounted antenna device.

BACKGROUND ART

Antennas provided on glass of vehicles are broadly classified into glass antennas and film antennas. In a glass antenna, an antenna element is embedded in advance in a glass plate such as the windshield or the rear window of an automobile. In a film antenna, an antenna element is affixed to a glass plate later. In either of these systems, a feed terminal and a ground terminal are provided on the antenna element side, and a circuit board is provided to connect these terminals with cables from external communication equipment such as a tuner. In general, this circuit board has, for example, an amplifier circuit mounted thereon for amplifying a reception signal from the antenna and is attached to a vehicle body (for example, a pillar) to be grounded.

A known example of the structure for holding a vehicle-mounted circuit board (vehicle-mounted circuit board holder structure) is mainly configured with a circuit board, a ground member, a cable crimp part, and an insulative cover, which are fitted in a catcher (Patent Literature 1, FIG. 1). Another known example has a structure in which a circuit board, one end of an antenna element, and respective core wires of an output cable and an electric supply cable are molded with resin so as to be encapsulated (Patent Literature 2, FIG. 2).

CITATION LIST

Patent Literature

[Patent Literature 1] Japanese Unexamined Patent Publication No. 2008-035479
[Patent Literature 2] Japanese Unexamined Patent Publication No. 2010-050886

SUMMARY OF INVENTION

Technical Problem

When the insulative cover disclosed in Patent Literature 1 is used, a metal shield case is used in order to satisfy electrical requirements. For this reason, the number of components as well as the production steps is increased, and size reduction is difficult. Molding the circuit board with resin as disclosed in Cited Literature 2 is advantageous in that waterproof is high. However, the strength against external force on a particular surface of the circuit board or external force in a torsion direction is so poor that stress is exerted on an element on the circuit board or a connection portion with the cable to possibly reduce the mechanical strength.

Since the antenna element used in an antenna device is installed, for example, on the windshield or the rear window of an automobile, the vehicle-mounted circuit board may be installed at a place with an insufficient space near the glass on the exterior of the vehicle, such as a pillar or an upper portion of glass of the vehicle. Size reduction as a whole is therefore required in holding a vehicle-mounted circuit board.

The present invention is made in view of the foregoing, and an object of the present invention is to provide a vehicle-mounted circuit board holder structure that ensures the mechanical strength for a vehicle-mounted circuit board, is highly waterproof, and is compact as a whole to hold the circuit board.

Solution to Problem

According to an aspect of the present invention, a vehicle-mounted circuit board holder structure includes a circuit board configured to process a signal from an antenna element; a holding member configured to hold the circuit board so as to sandwich the circuit board from both sides of a mount surface; and a mold member covering the circuit board and at least part of the holding member.

In the vehicle-mounted circuit board holder structure, the holding member may include a U-shaped portion configured to hold the circuit board therebetween.

In the vehicle-mounted circuit board holder structure, the holding member may have a base and a sidewall extending vertically to the base from an end of the base. The U-shaped portion may be provided to the sidewall.

In the vehicle-mounted circuit board holder structure, the holding member may have a support portion configured to support either the mount surface or an opposed surface of the circuit board.

In the vehicle-mounted circuit board holder structure, the circuit board may include a protrusion portion on at least one side surface thereof to support the circuit board by the holding member.

In the vehicle-mounted circuit board holder structure, the circuit board may be connected with a cable, and a gap for allowing the cable to pass through may be provided between the circuit board and the holding member in a side view.

In the vehicle-mounted circuit board holder structure, the circuit board may be connected with a cable, and an upper end of the holding member may be provided to a position higher than an upper end of the cable with reference to the mount surface.

In the vehicle-mounted circuit board holder structure, the holding member may be provided with a passage hole to allow a material of the mold member to pass through when the mold member is molded.

Advantageous Effects of Invention

The vehicle-mounted circuit board holder structure according to the present invention ensures the mechanical strength for a vehicle-mounted circuit board, is highly waterproof, and is compact as a whole to hold the circuit board.

BRIEF DESCRIPTION OF DRAWINGS

FIG. 3 is a plan view and a rear view of the circuit board in the vehicle-mounted circuit board holder structure according to the first embodiment.

FIG. 4 is a plan view and a side view of the holding member in the vehicle-mounted circuit board holder structure according to the first embodiment.

DESCRIPTION OF EMBODIMENTS (1) First Embodiment

An embodiment of a vehicle-mounted circuit board holder structure according to the present invention will be described below with reference to FIGS. 1 to 6.

Figure 1:
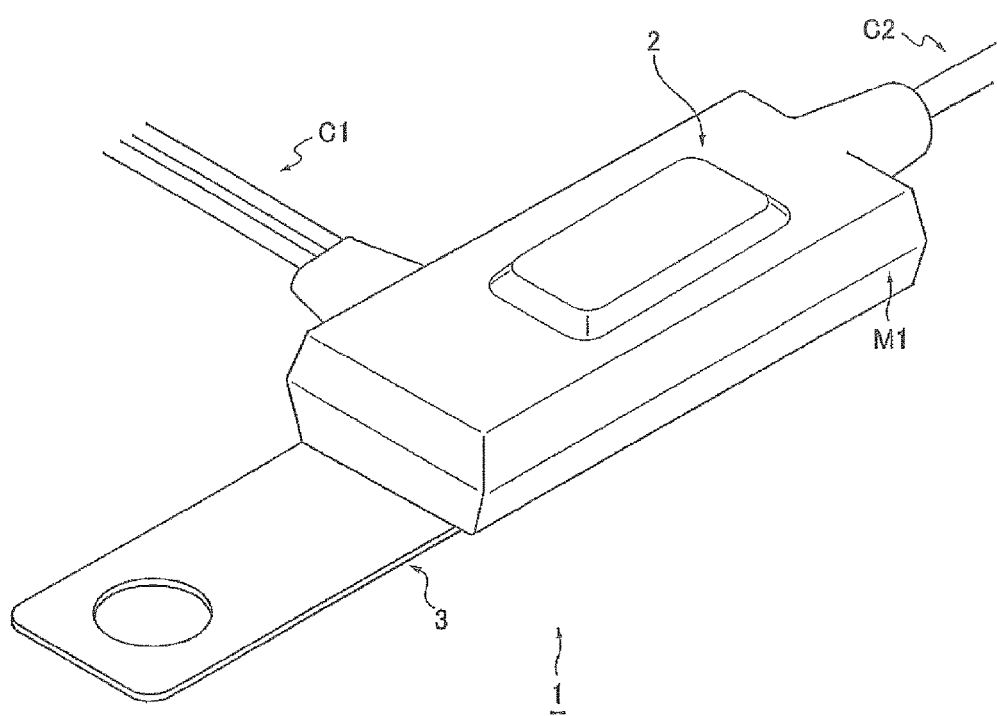
FIG. 1 is a perspective view of an appearance of a vehicle-mounted circuit board holder structure according to a first embodiment.
Figure 2:
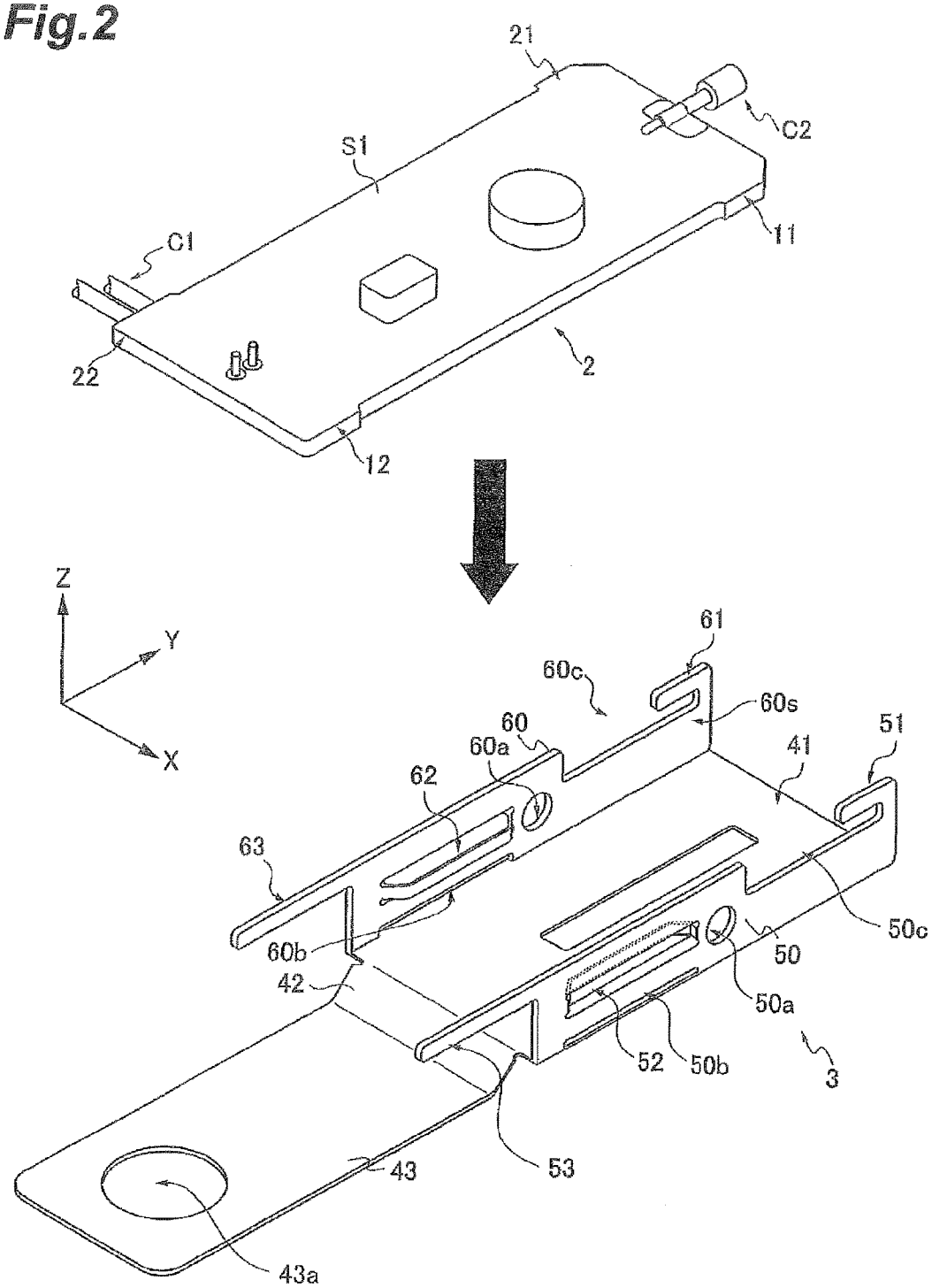
FIG. 2 is a perspective view of a circuit board and a holding member not covered with a mold member, in the vehicle-mounted circuit board holder structure according to the first embodiment.

FIG. 1 is a perspective view of an appearance of a vehicle-mounted circuit board holder structure 1 according to a first embodiment. FIG. 2 is a perspective view of a circuit board 2 and a holding member 3 not covered with a mold member M1, in the vehicle-mounted circuit board holder structure 1 according to the first embodiment. A coordinate system is defined in FIG. 2 for convenience of explanation below and referred to in the description of the drawings.

In the example described below, the vehicle-mounted circuit board holder structure 1 according to the present embodiment is a structure that holds a circuit board used for an antenna device mounted on a vehicle. Since an antenna element used in such an antenna device is installed on, for example, the windshield or the rear window of an automobile, the vehicle-mounted circuit board holder structure 1 is installed at a place with an insufficient space near the glass on the exterior of the vehicle, such as a pillar or an upper portion of glass of the vehicle, in order to obtain excellent antenna characteristics with a minimum effect of noise. It is therefore intended that the vehicle-mounted circuit board holder structure 1 in the present embodiment should ensure the mechanical strength of the circuit board against external force, be highly waterproof, and be compact as a whole.

FIG. 3(a) shows a plan view of the circuit board 2, and FIG. 3(b) shows a rear view of the circuit board 2. The circuit board 2 has a mount surface S1 and an opposed surface S2, which are a pair of main surfaces opposed to each other, and processes a signal from the antenna element. The mount surface S1 is a surface on which an element for processing a signal from the antenna signal is mounted. The opposed surface S2 is a surface opposite to the mount surface S1.

As shown in FIG. 3, a first cable C1 from the antenna element is connected to the vicinity of one end of the circuit board 2, and a second cable C2 from a tuner for AM/FM/DAB or the like is connected to the vicinity of the other end of the circuit board 2. The first cable C1 and the second cable C2 are connected to the circuit board 2, for example, by soldering. In this example, the second cable C2 is connected to the mount surface S1 of the circuit board 2. The first cable C1 extends via the opposed surface S2 opposite to the mount surface S1 of the circuit board 2 and passes through a through hole (hole portion) passing through from the opposed surface S2 to the mount surface S1 to be connected to the mount surface S1. A variety of elements for an amplifier circuit and a filter circuit are mounted on the mount surface S1 of the circuit board 2. In the present embodiment, single-side mounting is illustrated in which the circuit board 2 has the mount surface S1 on one side. Both-side mounting, however, may be employed in which elements are mounted additionally on the opposed surface S2. The first cable C1 and the second cable C2 may be connected to either the mount surface S1 or the opposed surface S2. For example, when the circuit board 2 is configured in the form of both-side mounting, the first cable C1 may be connected to the mount surface S1 through the through hole, and the second cable C2 may be connected to the opposed surface S2.

Although the first cable C1 and the second cable C2 are connected to the circuit board 2 in the present embodiment, at least one of the first cable C1 and the second cable C2 may not be connected to the circuit board 2. For example, the first cable C1 for connecting the antenna element with the circuit board 2 is not required when a terminal in direct contact with the antenna element from the circuit board 2 is provided or when the antenna element is capacitively coupled to an element on the circuit board 2.

As shown in FIG. 2 and FIG. 3, the circuit board 2 has a rectangular planar shape as a whole and has first protrusion portions 11, 21 and second protrusion portions 12, 22 on side surfaces thereof to support the circuit board 2 by the holding member 3. That is, the circuit board 2 is expanded in the X direction at positions where the first protrusion portions 11, 21 and the second protrusion portions 12, 22 are provided, as compared with the positions where the first protrusion portions 11, 21 and the second protrusion portions 12, 22 are not provided. As shown in FIG. 3(a), ground patterns g11, g21, g12, g22 are provided to respective four corners of the mount surface S1 of the circuit board 2 that include at least part of the first protrusion portions 11, 21 and the second protrusion portions 12, 22. These ground patterns are illustrated only in FIG. 3 and FIG. 5 and not illustrated in the other figures.

FIG. 4 shows a plan view and a side view of the holding member 3. As shown in FIG. 2 and FIG. 4, the holding member 3 has a base 41 having a rectangular planar shape as a whole. A pair of sidewalls 50, 60 for holding the circuit board 2 are formed vertically from both ends of the base 41 upward (the +Z direction). A pair of U-shaped portions 51, 61 are provided to one ends of the sidewalls 50, 60. The U-shaped portions 51, 61 are provided to hold the first protrusion portions 11, 21 of the circuit board 2 therebetween and sandwich the mount surface S1 of the circuit board 2 from both sides.

In the U-shaped portions 51, 61, "U-shape" may have an opening in one place and opposing element members with the opening interposed therebetween, and the opening may be oriented in any direction. The opposing element members are opposed to each other as a whole so that the circuit board 2 inserted from the opening can be held therebetween. The portions that may come into contact with the circuit board 2 may not be formed in a straight line. The portions that may come into contact with the circuit board 2 may be formed in a curved shape or a serrate shape.

A pair of first support portions 52, 62 are provided to positions away from the U-shaped portions 51, 61 in the front-back direction (Y direction) of the sidewalls 50, 60. As shown in FIG. 4, the first support portions 52, 62 are respectively formed so as to project inward from reference planes 50s, 60s of the sidewalls 50, 60 and are provided to support the opposed surface S2 opposite to the mount surface S1 of the circuit board 2. The distance between the reference plane 50s and the reference plane 60s is set to be slightly larger than the width in the X direction of the part of the circuit board 2 excluding the protrusion portions so that the circuit board 2 can be inserted from above. On the other hand, the distance between the first support portion 52 and the first support portion 62 is set to be smaller than the width in the X direction of the part of the circuit board 2 excluding the protrusion portions.

Second support portions 53, 63 are provided to the ends of the sidewalls 50, 60 on the side opposite to the ends provided with the U-shaped portions 51, 61. The second support portions 53, 63 are formed with elongated protrusions projecting from the upper ends of the sidewalls 50, 60 in the −Y direction and are provided to support the mount surface S1 of the circuit board 2.

As will be described later, in the vehicle-mounted circuit board holder structure 1 in the present embodiment, the mold member M1 is molded by pouring a resin material into a mold with the circuit board 2 held by the holding member 3. In doing so, in order to pour the resin into the mold efficiently, as shown in FIG. 4, a passage hole 41a for allowing the resin material to pass through is provided to the base 41 of the holding member 3, and passage holes 50a, 60a for allowing the resin material to pass through are provided on the sidewalls 50, 60 as well. The sizes of the passage hole 41a and the passage holes 50a, 60a are set as appropriate so as not to significantly reduce the strength of the holding member 3. The provision of the passage hole 41a and the passage holes 50a, 60a also can reduce the weight of the vehicle-mounted circuit board holder structure 1.

Notches 50b, 60b are formed at the joint portions with the base 41 in the sidewalls 50, 60. The notches 50b, 60b are provided in order to facilitate the process of bending the sidewalls 50, 60 with respect to the base 41. The lengths of the notches 50b, 60b are set as appropriate to such a degree that the rigidity in the bending direction of the sidewalls 50, 60 is not significantly reduced.

As shown in FIG. 2, the base 41 may extend to an extension portion 43 with an inclined portion 42 interposed therebetween. The extension portion 43 has a fastening hole 43a for fixing to the vehicle body when the vehicle-mounted circuit board holder structure 1 is mounted on a vehicle. The extension portion 43 has a relatively large area to provide a good grounding characteristic and, in addition, has the effects of electrostatic shielding and electromagnetic shielding.

It should be noted that the provision of the inclined portion 42 and the extension portion 43 is not essential. The vehicle-mounted circuit board holder structure 1 may be fixed to the vehicle body, for example, with a double-faced tape and grounded, for example, at the middle of the second cable C2.

As shown in the side view in FIG. 4, the inclined portion 42 is formed such that the extension portion 43 is lowered relative to the base 41 as viewed from the side (that is, arranged in the −Z direction relative to the base 41). This is to provide a sufficient gap between the opposed surface S2 of the circuit board 2 and the extension portion 43 when the circuit board 2 is held by the holding member 3, thereby securing a path for the first cable C1 connected to the opposed surface S2 of the circuit board 2. Although the first cable C1 extends in the −X direction in the example shown in FIG. 2, the provision of a sufficient gap between the opposed surface S2 of the circuit board 2 and the extension portion 43 in a side view of the holding member 3 (that is, viewed in the −X direction) enables the first cable C1 to be pulled out in either of the −X direction and the +X direction. Thus, the direction of pulling out the first cable C1 can be selected in accordance with the position where the vehicle-mounted circuit board holder structure 1 is installed.

The holding member 3 can be easily produced by cutting and punching a conductive flat plate, followed by a bending process.

Figure 5:
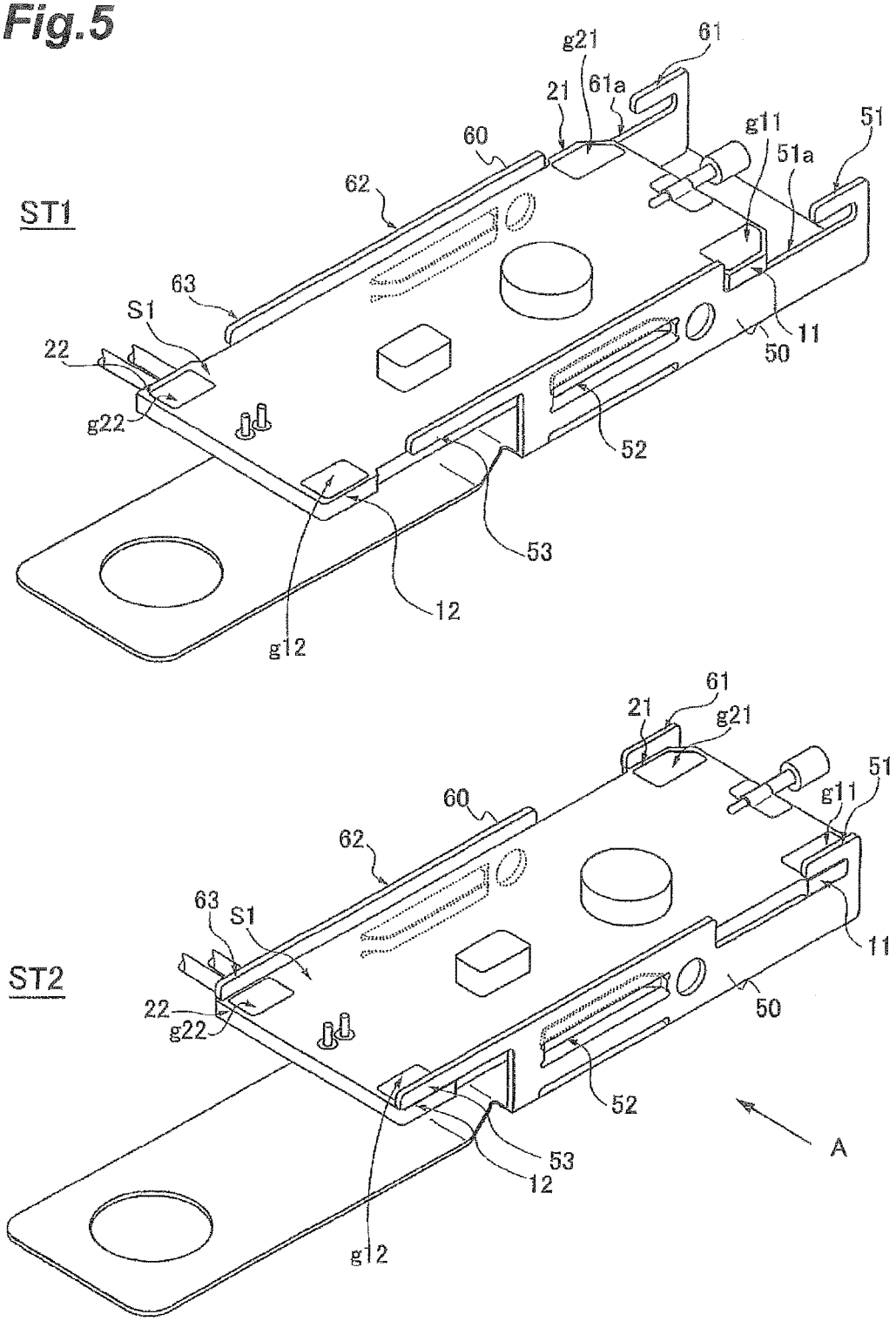
FIG. 5 illustrates a method of holding the circuit board in the holding member, in the vehicle-mounted circuit board holder structure according to the first embodiment.

Referring to FIG. 5, a method of holding the circuit board 2 in the holding member 3 will now be described. In FIG. 3, a state ST1 shows a state in which the circuit board 2 is not held in the holding member 3, and a state ST2 shows a state in which the circuit board 2 is held in the holding member 3.

To hold the circuit board 2 in the holding member 3, first, the first protrusion portions 11, 21 of the circuit board 2 are inserted into the openings 50c, 60c of the sidewalls 50, 60 of the holding member 3 from above. As shown in the state ST1 in FIG. 5, the first protrusion portions 11, 21 of the circuit board 2 are then rested on resting surfaces 51a, 61a of the U-shaped portions 51, 61, and the opposed surface S2 of the circuit board 2 is supported on the first support portions 52, 62 of the holding member 3. In this state, the second protrusion portions 12, 22 of the circuit board 2 are at positions away from the second support portions 53, 63 in the front-back direction (Y direction) and therefore not supported on the second support portions 53, 63.

The circuit board 2 in the state ST1 is then slid in the +Y direction, and the first protrusion portions 11, 21 of the circuit board 2 are inserted into the U-shaped portions 51, 61 to bring about the state ST2. In the state ST2, since the first protrusion portions 11, 21 of the circuit board 2 have been inserted in the U-shaped portions 51, 61, the mount surface S1 and the opposed surface S2 of the circuit board 2 are supported by the U-shaped portions 51, 61. Also in the state ST2, the opposed surface S2 of the circuit board 2 is supported on the first support portions 52, 62 of the holding member 3 in the same manner as in the state ST1. In addition, because of the sliding of the circuit board 2 in the +Y direction, the second protrusion portions 12, 22 of the circuit board 2 come into surface contact with the second support portions 53, 63 of the holding member 3 on the opposed surface S2 side, and the opposed surface S2 of the circuit board 2 is supported by the second protrusion portions 12, 22.

Figure 6:
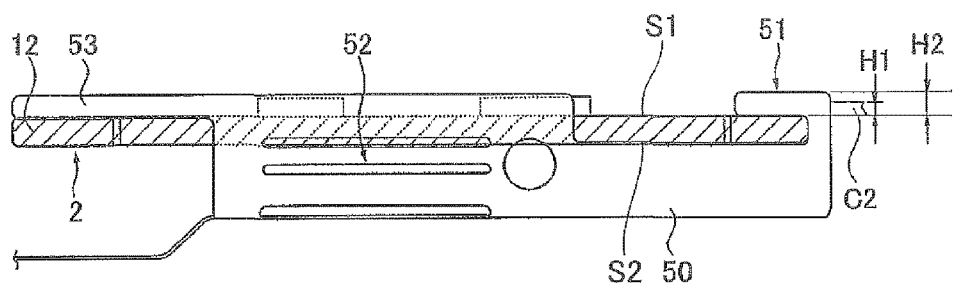
FIG. 6 is a side view of the circuit board held in the holding member, in the vehicle-mounted circuit board holder structure according to the first embodiment.

FIG. 6 illustrates the state ST2 in FIG. 5 as viewed from the arrow A (that is, a side view). As shown in FIG. 6, in the state in which the circuit board 2 is held in the holding member 3, the mount surface S1 of the circuit board 2 is two-point supported on one side by the U-shaped portions 51, 61 and the second support portions 53, 63, and the opposed surface S2 of the circuit board 2 is two-point supported on one side by the U-shaped portions 51, 61 and the first support portions 52, 62. It can be understood that the circuit board 2 is thus stably supported by the holding member 3.

In production of the vehicle-mounted circuit board holder structure 1, after the circuit board 2 is held in the holding member 3, the four corners of the circuit board 2 are soldered to the holding member 3. Specifically, as shown in the state ST2 in FIG. 5, in the state in which the circuit board 2 is held in the holding member 3, the ground patterns g11, g21 on the mount surface S1 of the circuit board 2 are respectively disposed in the vicinity of the U-shaped portions 51, 61, and the ground patterns g12, g22 of the mount surface S1 of the circuit board 2 are respectively disposed in the vicinity of the second support portions 53, 63. The ground patterns g11, g21 are then respectively soldered to the U-shaped portions 51, 61, and the ground patterns g12, g22 are respectively soldered to the second support portions 53, 63. The circuit board 2 thus can be grounded through the extension portion 43 of the holding member 3. As shown in FIG. 6, in the state in which the circuit board 2 is held in the holding member 3, the upper surfaces of the U-shaped portions 51, 61 and the second support portions 53, 63 are at a position higher than the mount surface S1 of the circuit board 2 (that is, project above the mount surface S1). The soldering operation therefore can be easily performed in this state.

After soldering at the four corners of the circuit board 2, the holding member 3 with the circuit board 2 held therein is set in a mold having a predetermined shape, and the mold is clamped and then filled with molten resin. In doing so, the molten resin can be efficiently charged because the holding member 3 is provided with the passage hole 41a and the passage holes 50a, 60a for allowing the molten resin to pass through. The molten resin is then hardened under a relatively low-pressure condition to mold the mold member M1. In order not to damage the second cable C2 in clamping the mold, the height H2 of the upper end of the holding member 3 may be provided to a location higher than the height H1 of the upper end of the second cable C2 with reference to the mount surface S1 of the circuit board 2. In the example of the present embodiment, the upper end of the holding member 3 is the upper ends of the sidewalls 50, 60 (that is, the upper ends of the U-shaped portions 51, 61 or the second support portions 53, 63) with reference to the mount surface S1 of the circuit board 2. The upper end of the holding member 3 can be set higher than the upper end of the second cable C2 to protect the second cable C2 from external force on the vehicle-mounted circuit board holder structure 1 from above.

The area where the mold member M1 is molded may include the entire circuit board 2 and at least part of the holding member 3, as shown in FIG. 1. That is, the holding member 3 may not be entirely covered with the mold member M1.

As described above, the vehicle-mounted circuit board holder structure 1 in the present embodiment can hold the circuit board 2 in a compact size as a whole while ensuring the mechanical strength for the vehicle-mounted circuit board 2, because at least part of the circuit board 2 is held by the holding member 3 so as to be sandwiched from both sides of a pair of main surfaces, that is, the mount surface S1 and the opposed surface S2, and the circuit board 2 and the holding member 3 are covered with the mold member M1. In particular, in the present embodiment, the structure has a high strength against input from the top surface, the side surfaces, and the bottom surface, and torsion input and bending input and ensures a sufficient mechanical strength for the circuit board 2, because, as shown in FIG. 6, the circuit board 2 is fitted between the sidewalls 50 and 60 of the holding member 3 such that the cable connected to the circuit board 2 does not extend beyond the upper end of the holding member 3, and the holding member 3 has the base 41 and the U-shaped form in cross section formed with the sidewalls 50, 60.

Moreover, the vehicle-mounted circuit board holder structure does not require a component such as a cover and is compact as a whole and highly waterproof, because it is molded with the mold member with the circuit board 2 fitted in the holding member 3. The vehicle-mounted circuit board holder structure 1 in the present embodiment can be installed at any position on the exterior of the vehicle, because it is compact and highly waterproof.

Although a pair of U-shaped portions 51, 61 are provided in the foregoing embodiment, embodiments are not limited thereto. That is, the circuit board 2 can be held even when the U-shaped portion is provided to either of the sidewalls 50, 60.

Other embodiments of the vehicle-mounted circuit board holder structure according to the present invention will be disclosed below. In the vehicle-mounted circuit board holder structure according to any of the following embodiments, the circuit board is held by the holding member so as to be sandwiched from both sides of the mount surface, and the circuit board and the holding member are covered with the mold member, whereby the same effects as in the first embodiment can be achieved.

(2) Second Embodiment

Figure 7:
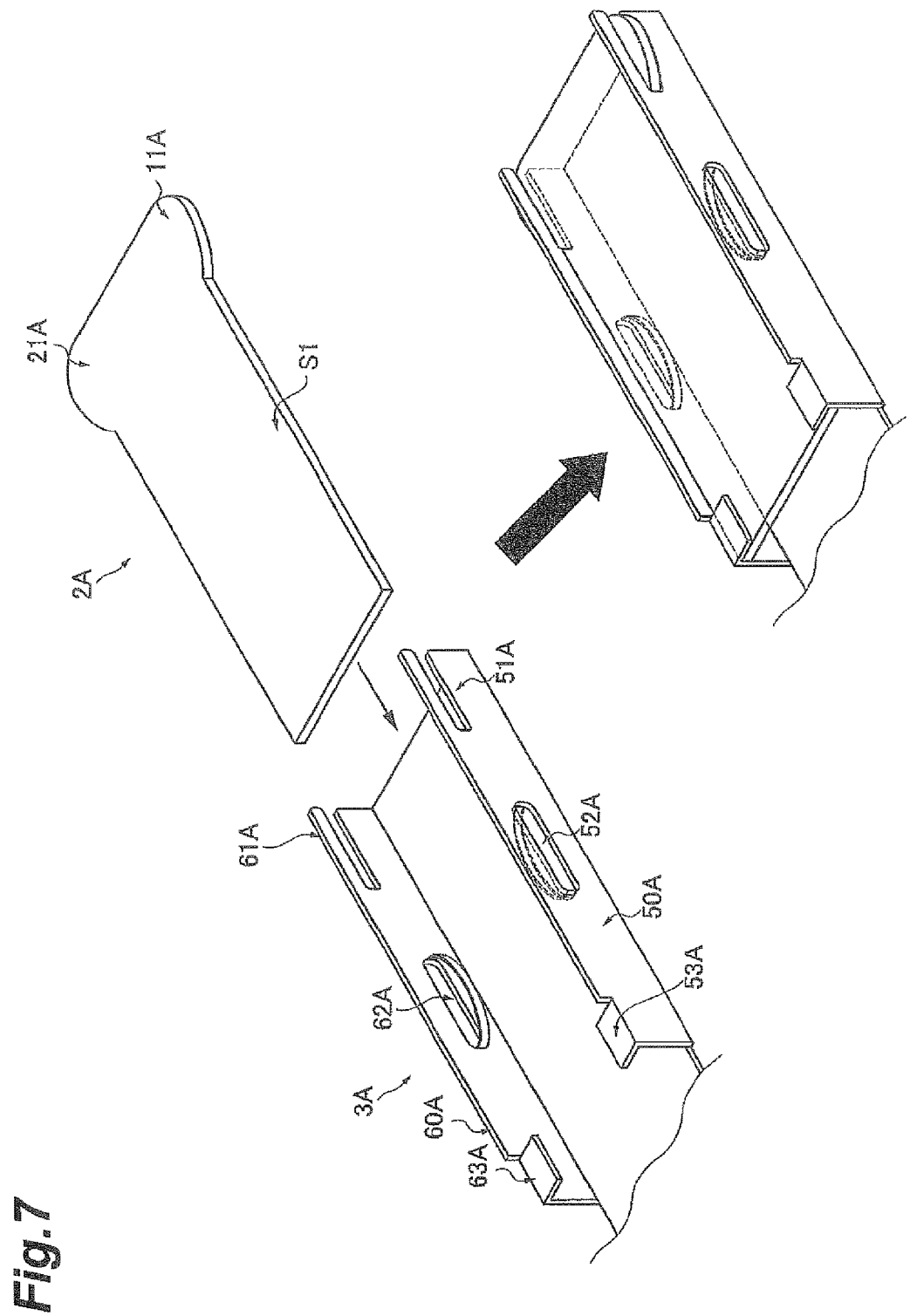
FIG. 7 is a perspective view illustrating a manner in which a circuit board is held by a holding member, in the vehicle-mounted circuit board holder structure in a second embodiment.

Referring to FIG. 7, the vehicle-mounted circuit board holder structure according to a second embodiment will be described. FIG. 7 is a perspective view illustrating a manner in which a circuit board 2A is held by a holding member 3A, in the vehicle-mounted circuit board holder structure in the second embodiment.

In the vehicle-mounted circuit board holder structure 1 according to the first embodiment, the second support portions 53, 63 formed with elongated protrusions projecting from the upper ends of the sidewalls 50, 60 of the holding member 3 in the −Y direction come into contact with the second protrusion portions 12, 22 of the circuit board 2 to support the mount surface S1 of the circuit board. The mount surface of the circuit board, however, may be supported by any other method. That is, the second support portion may not be an elongated protrusion, and the circuit board may not have the second protrusion portion.

As shown in FIG. 7, the vehicle-mounted circuit board holder structure in the present embodiment is produced by inserting the circuit board 2A into the holding member 3A in the direction of the arrow to be held therein, and thereafter soldering the circuit board 2A and the holding member 3A and covering the circuit board 2A and at least part of the holding member 3A with a mold member. Unlike the first embodiment, second support portions 53A, 63A of sidewalls 50A, 60A of the holding member 3A are formed so as to be bent inward. The circuit board 2A is inserted into the holding member 3A from the direction of the arrow, whereby first protrusion portions 11A, 21A of the circuit board 2A are held in U-shaped portions 51A, 61A of the sidewalls 50A, 60A, and the mount surface S1 of the circuit board 2A comes into surface contact with the lower surfaces of the second support portions 53A, 63A so that the mount surface S1 is supported. In FIG. 7, the second support portions 53A, 63A may not be provided as described above.

In the configuration shown in FIG. 7, the holding member 3A is provided with the first support portions 52A, 62A to support the opposed surface of the circuit board 2A. The first support portions 52A, 62A, however, may be eliminated.

In the vehicle-mounted circuit board holder structure according to the foregoing embodiments, the U-shaped portion of the holding member is formed along the reference plane of the sidewall. The U-shaped portion, however, may not be oriented along the reference plane of the sidewall. For example, the U-shaped portion may be formed so as to be oriented inward (that is, so as to be U-shaped as viewed from the Y axis), unlike the foregoing embodiments. In this case, the U-shaped portion may not be located at an end portion of the holding member.

(3) Third Embodiment

Figure 8:
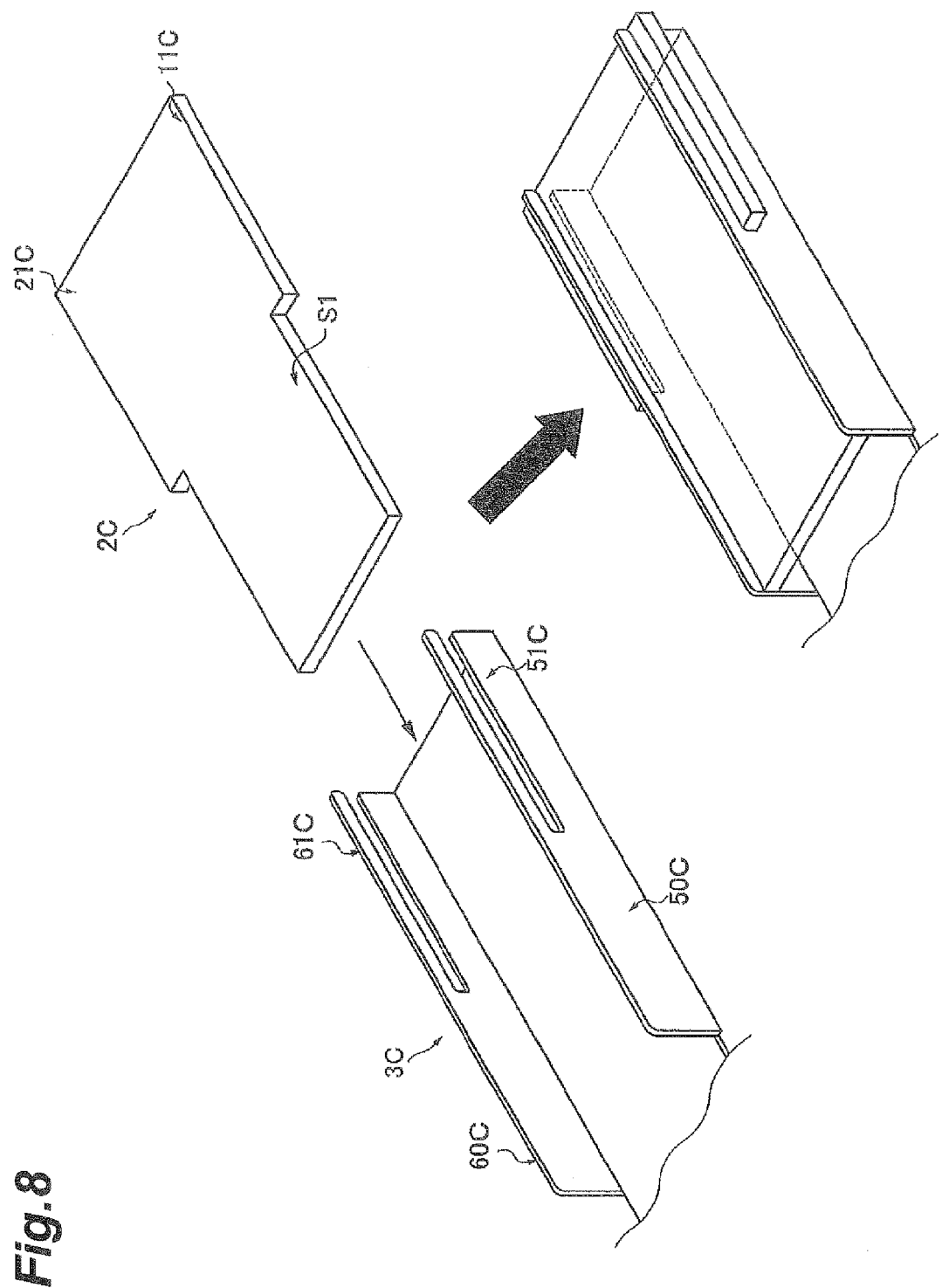
FIG. 8 is a perspective view illustrating a manner in which a circuit board is held by a holding member, in the vehicle-mounted circuit board holder structure in a third embodiment.

Referring to FIG. 8, the vehicle-mounted circuit board holder structure according to a third embodiment will be described. FIG. 8 is a perspective view illustrating a manner in which a circuit board 2C is held by a holding member 3C, in the vehicle-mounted circuit board holder structure in the third embodiment.

In the vehicle-mounted circuit board holder structure 1 according to the first embodiment, the mount surface S1 and the opposed surface S2 of the circuit board 2 are respectively supported by the first support portions 52, 62 and the second support portions 53, 63 of the sidewalls 50, 60 of the holding member 3. The first support portions and the second support portions, however, may not be provided. That is, the circuit board may be supported by the U-shaped portions alone.

As shown in FIG. 8, the vehicle-mounted circuit board holder structure in the present embodiment is produced by inserting the circuit board 2C into the holding member 3C in the direction of the arrow to be held therein, and thereafter soldering the circuit board 2C and the holding member 3C and covering the circuit board 2C and at least part of the holding member 3C with a mold member. Unlike the first embodiment, the holding member 3C does not have the first support portions or the second support portions. The circuit board 2C is inserted into the holding member 3C from the direction of the arrow, whereby first protrusion portions 11C, 21C of the circuit board 2C are held in U-shaped portions 51C, 61C of the sidewalls 50C, 60C. In this example, in order to support the circuit board 2C with the U-shaped portions 51C, 61C alone, the longitudinal lengths of the first protrusion portions 11C, 21C held in the U-shaped portions 51C, 61C are set to be relatively long. The lengths, however, may be set as appropriate.

In the present embodiment, the U-shaped portions 51C, 61C may not be provided to end portions of the holding member 3C. That is, the U-shaped portions 51C, 61C can be provided to any positions in the longitudinal direction of the holding member 3C.

In the foregoing embodiments, the U-shaped portion of the holding member is provided to a position on the opposite side of the first cable C1 in the circuit board in the longitudinal direction. The U-shaped portion, however, may be provided on the same side as the first cable C1 in the longitudinal direction.

(4) Fourth Embodiment

Figure 9:
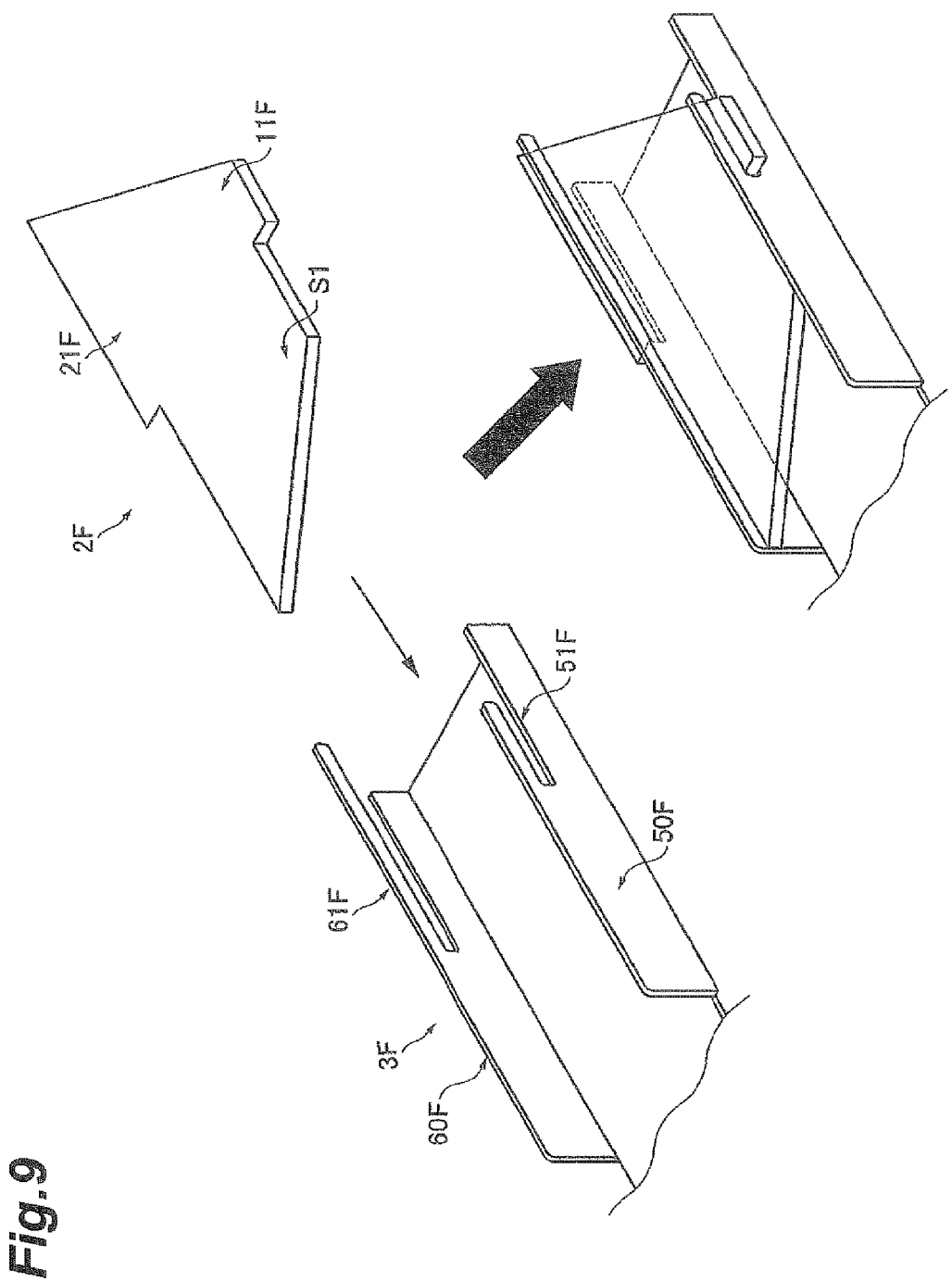
FIG. 9 is a perspective view illustrating a manner in which a circuit board is held by a holding member, in the vehicle-mounted circuit board holder structure in a fourth embodiment.

Referring to FIG. 9, the vehicle-mounted circuit board holder structure according to a fourth embodiment will be described. FIG. 9 is a perspective view illustrating a manner in which a circuit board 2F is held by a holding member 3F, in the vehicle-mounted circuit board holder structure in the fourth embodiment.

In the vehicle-mounted circuit board holder structure 1 according to the first embodiment, the circuit board is rectangular. The circuit board, however, may not be rectangular. For example, the circuit board may be square or trapezoidal.

FIG. 9 illustrates an example in which the circuit board is trapezoidal. As shown in FIG. 9, the vehicle-mounted circuit board holder structure in the present embodiment is produced by inserting the circuit board 2F into the holding member 3F in the direction of the arrow to be held therein, and thereafter covering the circuit board 2F and at least part of the holding member 3F with a mold member.

As shown in FIG. 9, the vehicle-mounted circuit board holder structure in the present embodiment is produced by soldering the circuit board 2F and the holding member 3F after the circuit board 2F is held in the holding member 3F, and covering the circuit board 2F and at least part of the holding member 3F with a mold member. Unlike the first embodiment, since the circuit board 2F is formed in a trapezoidal shape as a whole, the U-shaped portion 51F of the holding member 3F differs from the U-shaped portion 61 F, and the first protrusion portion 11 F differs from the first protrusion portion 21 F, in length in the longitudinal direction.

(5) Fifth Embodiment

Figure 10:
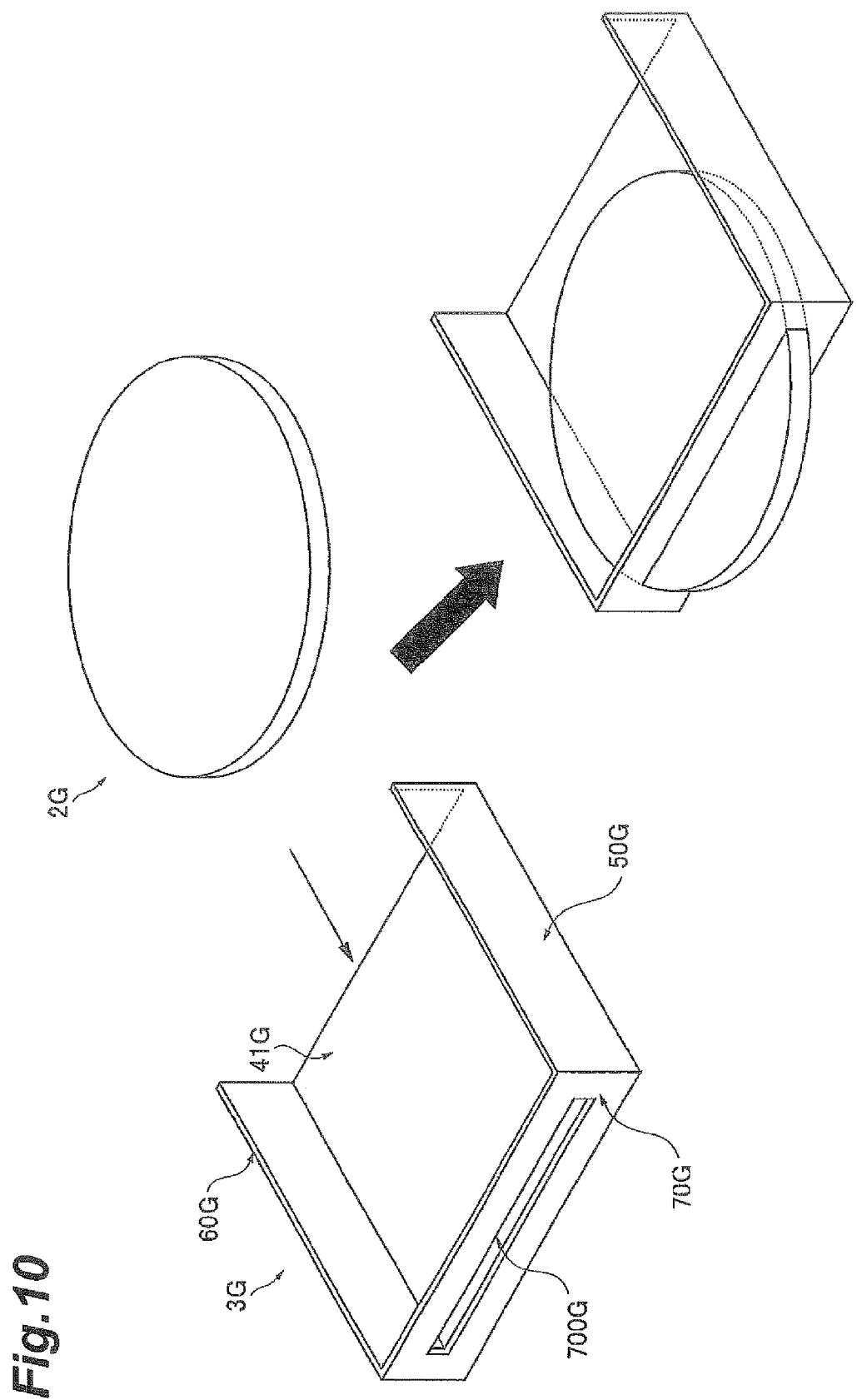
FIG. 10 is a perspective view illustrating a manner in which a circuit board is held by a holding member, in the vehicle-mounted circuit board holder structure in a fifth embodiment.

Referring to FIG. 10, the vehicle-mounted circuit board holder structure according to a fifth embodiment will be described. FIG. 10 is a perspective view illustrating a manner in which a circuit board 2G is held by a holding member 3G, in the vehicle-mounted circuit board holder structure in the fifth embodiment.

In the vehicle-mounted circuit board holder structure 1 according to the first embodiment, the circuit board is rectangular. The circuit board, however, may not be rectangular. For example, the circuit board may be circular or oval.

FIG. 10 illustrates an example in which the circuit board is circular. As shown in FIG. 10, the vehicle-mounted circuit board holder structure in the present embodiment is produced by inserting the circuit board 2G into the holding member 3G in the direction of the arrow to be held therein, and thereafter soldering the circuit board 2G and the holding member 3G and covering the circuit board 2G and at least part of the holding member 3G with a mold member.

The holding member 3G in the present embodiment is in the form of a cube or a rectangular parallelepiped as a whole, and sidewalls 50G, 60G, 70G are formed on a rectangular or square base 41G The circuit board 2G is inserted into the holding member 3G from the direction opposed to the sidewall 70G. The sidewall 70G has a slit 700G having a width shorter than the diameter of the circular circuit board 2G, and the circuit board 2G is fitted in the slit 700G and held such that the mount surface S1 of the circuit board 2G is sandwiched from both sides.

(6) Sixth Embodiment

Figure 11:
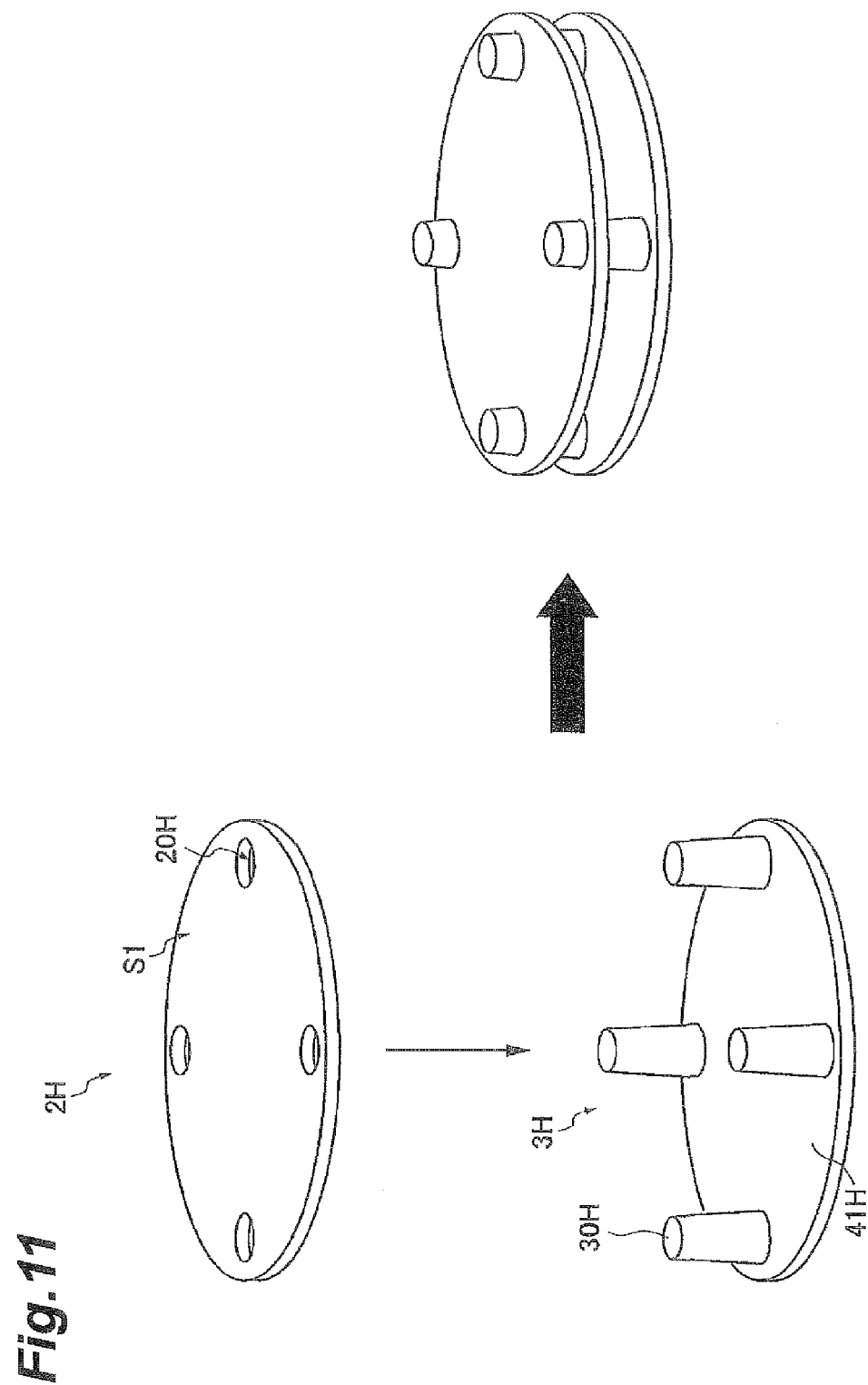
FIG. 11 is a perspective view illustrating a manner in which a circuit board is held by a holding member, in the vehicle-mounted circuit board holder structure in a sixth embodiment.

Referring to FIG. 11, the vehicle-mounted circuit board holder structure according to a sixth embodiment will be described. FIG. 11 is a perspective view illustrating a manner in which a circuit board 2H is held by a holding member 3H, in the vehicle-mounted circuit board holder structure in the sixth embodiment.

The vehicle-mounted circuit board holder structure according to the present embodiment is an example, different from the fifth embodiment, of the circuit board holder structure in which the circuit board is circular or oval.

FIG. 11 illustrates an example in which the circuit board is circular. As shown in FIG. 11, the vehicle-mounted circuit board holder structure in the present embodiment is produced by inserting the circuit board 2H into the holding member 3H in the direction of the arrow to be held therein, and thereafter soldering the circuit board 2H and the holding member 3H and covering the circuit board 2H and part of the holding member 3H with a mold member.

The holding member 3H in the present embodiment has two or more protrusions 30H (four in the example in FIG. 11) provided upward from a base 41H. The protrusions 30H of the holding member 3H are formed by, for example, cutting. The protrusions 30H each have a tapered shape with its diameter decreasing upward. On the other hand, the mount surface S1 of the circuit board 2H has two or more holes 20H (four in the example in FIG. 11). The holes 20H are fitted on the protrusions 30H of the holding member 3H from above, whereby the circuit board 2H is held in the holding member 3H.

Although FIG. 11 shows a circular circuit board by way of illustration, the holding method in the present embodiment can be applied irrespective of the form of the circuit board. That is, a hole portion may be provided in the circuit board, irrespective of the form of the circuit board, and a protrusion corresponding to the hole portion in the circuit board may be provided in the holding member, so that the hole portion and the protrusion are coupled to each other. A protrusion may be provided on the circuit board, and a hole portion may be provided in the holding member.

In a holder structure similar to the present embodiment, the circuit board and the holding member may be joined to each other using linear conducive members in place of the protrusions 30H. For example, two or more slots for allowing the linear conducive members to pass through are provided in the circuit board, and holding members formed with a pair of metal flat plates are provided above and below the circuit board so as to sandwich the circuit board. Both ends of the linear conductive member passed through the circuit board are respectively connected to the pair of metal flat plates serving as the holding members, for example, by soldering.

(7) Seventh Embodiment

Figure 12:
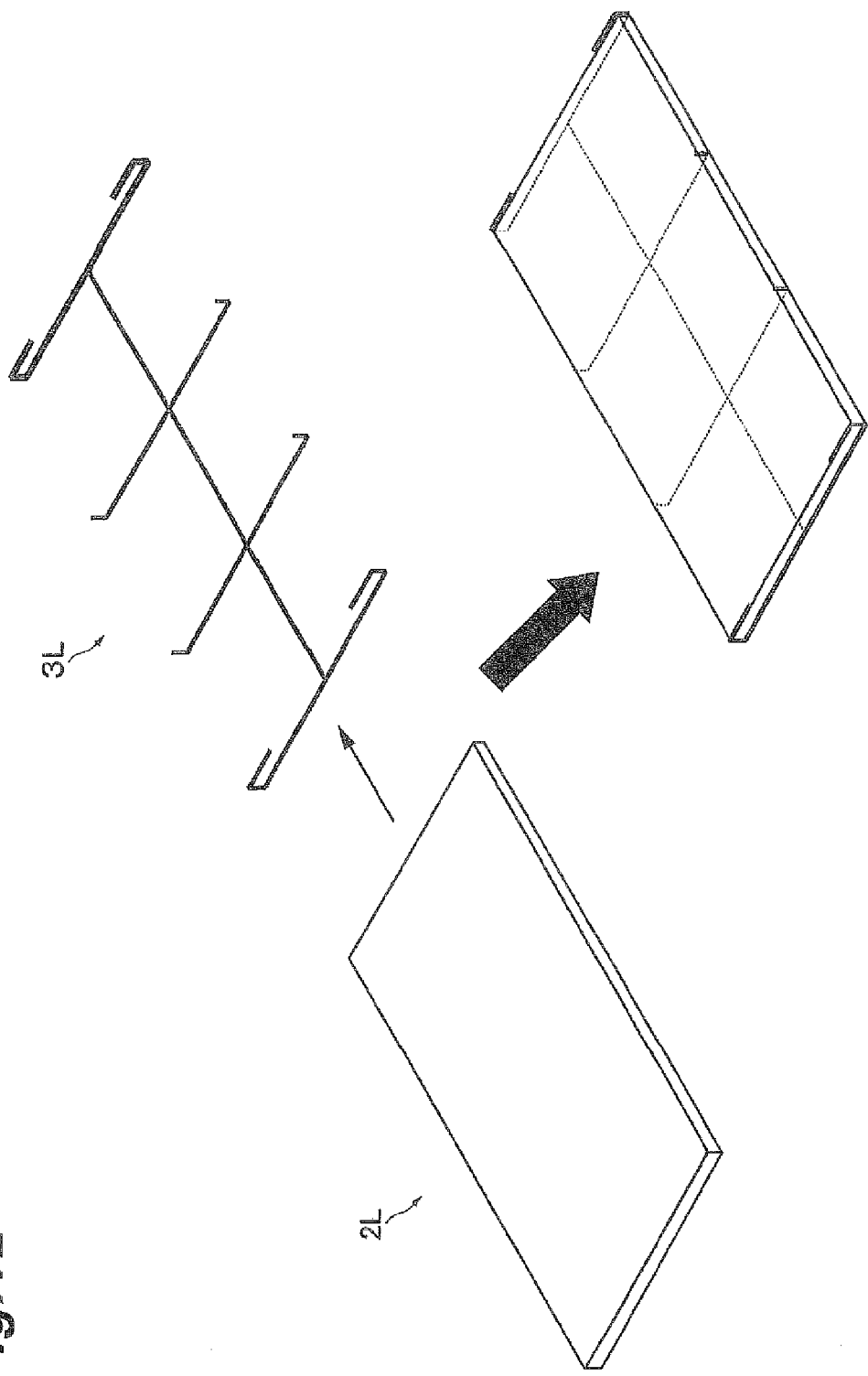
FIG. 12 is a perspective view illustrating a manner in which a circuit board is held by a holding member, in the vehicle-mounted circuit board holder structure in a seventh embodiment.

Referring to FIG. 12, the vehicle-mounted circuit board holder structure according to a seventh embodiment will be described. FIG. 12 is a perspective view illustrating a manner in which a circuit board 2L is held by a holding member 3L, in the vehicle-mounted circuit board holder structure in the seventh embodiment.

The holding member used in the vehicle-mounted circuit board holder structure according to the foregoing embodiments is produced by shaping a conductive flat plate or additionally by cutting. The holding member, however, may not be in the form of such a flat plate.

The holding member 3L shown in FIG. 12 is formed with a linear conductive material and is shaped in the form that holds the circuit board 2L as a whole. The conductive material is selected from materials that, though formed in a linear shape, can improve the strength of the circuit board 2L, in particular, in a torsion direction and a bending direction (for example, metals such as steel or hard resins such as POM). The holding member 3L can be fabricated by pressing a thin-wire metal material. The vehicle-mounted circuit board holder structure in the present embodiment is produced by inserting the circuit board 2L into the holding member 3L in the direction of the arrow to be held therein, and thereafter soldering the circuit board 2L and the holding member 3L and covering the circuit board 2L and at least part of the holding member 3L with a mold member.

Although a plurality of embodiments of the vehicle-mounted circuit board holder structure of the present invention have been described in details above, the present invention is not limited to the description of the embodiments. The embodiments are susceptible to various modifications and changes without departing from the scope of the present invention, as a matter of course. For example, the technical matters described in the embodiments may be applied in combination as appropriate.

In the foregoing embodiments, the holding member may be formed using a non-conductive material, rather than a conductive material. For example, the holding member can be formed of a hard plastic material to achieve the strength to the same degree as when it is formed with a conductive material such as metal.

In the foregoing embodiments, the structure for holding a circuit board used for an antenna device mounted on a vehicle has been illustrated by way of example. The applicable range of the present invention, however, is not limited to an antenna device, and the present invention can be used for holding a circuit board in any other applications.

REFERENCE SIGNS LIST

1 . . . vehicle-mounted circuit board holder structure, 2 . . . circuit board, S1 . . . mount surface, S2 . . . opposed surface, 11, 21 . . . first protrusion portion, 12, 22 . . . second protrusion portion, 3 . . . holding member, 41 . . . base, 41a . . . passage hole, 42 . . . inclined portion, 43 . . . extension portion, 43a . . . fastening hole , 50, 60 . . . sidewall, 50a, 60a . . . passage hole, 50b, 60b . . . notch, 50c, 60c . . . opening, 51, 61 . . . U-shaped portion, 51a, 61a . . . resting surface, 52, 62 . . . first support portion, 53, 63 . . . second support portion, C1 . . . first cable, C2 . . . second cable, M1 . . . mold member.

The invention claimed is:

1. A vehicle-mounted circuit board holder structure comprising:
   a circuit board having a mount surface to mount a circuit configured to process a signal from an antenna element, the circuit board further having a first side corresponding to the mount surface and a second side opposite the first side, the circuit board further having two protrusion portion protruding in different directions from each other;
   a holding member configured to hold the circuit board, the holding member comprising a base and two sidewalls extending from the base and including two openings that are respectively formed in the two sidewalls and configured to slidingly receive the two protrusion portions so that each of the two sidewalls sandwiches the circuit board from both the first and second sides; and
   a mold member covering the circuit board and at least part of the holding member.

2. The vehicle-mounted circuit board holder structure according to claim 1, wherein the two openings are formed in U-shaped portion of the two sidewalls, respectively.

3. The vehicle-mounted circuit board holder structure according to claim 1, wherein a width of the mount surface is less than a distance between the two sidewalls, and the two protrusion portions protrude along the width of the mount surface into the two openings.

4. The vehicle-mounted circuit board holder structure according to claim 1, wherein the holding member has a support portion configured to support either the first side or the second side.

5. The vehicle-mounted circuit board holder structure according to claim 1, wherein
the circuit board is connected with a cable, and
a gap for allowing the cable to pass through is provided between the circuit board and the holding member in a side view.

6. The vehicle-mounted circuit board holder structure according to claim 1, wherein
the circuit board is connected with a cable, and
an upper end of the holding member is provided to a position higher than an upper end of the cable with reference to the mount surface.

7. The vehicle-mounted circuit board holder structure according to claim 1, wherein
the holding member is provided with a passage hole to allow a material of the mold member to pass through when the mold member is molded.

8. The vehicle-mounted circuit, board holder structure according to claim 1, wherein
the two protrusion portions are located at a first end of the circuit board adjacent to the two openings, and
the circuit board further has two second protrusion portions located at a second end of the circuit board opposite the first end, and the two second protrusion portions protrude in opposite directions from each other.

9. The vehicle-mounted circuit board holder structure according to claim 8, wherein
each of the two sidewalls includes an, elongated protrusion that projects from an upper end of the two sidewalls to contact the two second protrusion portions at the second side of tine circuit board.

10. The vehicle-mounted circuit board holder structure according to claim 1, wherein
the two protrusion portions protrude in opposite directions from each other, and
the two openings pass completely through the two sidewalls.

11. A vehicle-mounted circuit board holder structure comprising:
a circuit board configured to process a signal from an antenna element, the circuit board having a pair of main surfaces opposite one another, at least one of the main surfaces comprising a mount surface to mount a circuit, the main surfaces defining main respective sides and a width of the circuit board, the circuit board including a pair of protrusion portions protruding in opposite directions from each other in a width direction of the circuit board;
a holding member configured to hold the circuit board, the holding member comprising a base and two sidewalls extending from the base, a distance between the two sidewalls greater than the width of the circuit board, the two sidewalls including a pair of openings that are configured to receive the pair of protrusion portions so that the two sidewalls separately sandwich the circuit board from both of the main sides; and
a mold member covering the circuit board and at least part of the holding member.

12. The vehicle-mounted circuit board holder structure according to claim 11, wherein the openings are formed in a U-shaped portion of the two sidewalls, respectively, in order to slidingly receive the pair of protrusion portions.

13. The vehicle-mounted circuit board holder structure according to claim 11, wherein the holding member has a support portion configured to support the circuit board from either one of the main sides.

14. The vehicle-mounted circuit board holder structure according to claim 11, wherein,
the circuit board is connected with a cable, and
a gap for allowing the cable to pass through is provided between the circuit board and the holding member in a side view.

15. The vehicle-mounted circuit board holder structure according to claim 11, wherein
the circuit board is connected with a cable, and
an upper end of the holding member is provided to a position higher than an upper end of the cable with reference to one of the main surfaces.

16. The vehicle-mounted circuit board holder structure according to claim 11, wherein
the holding member is provided with a passage hole to allow a material of the mold member to pass through when the mold member is molded.

17. The vehicle-mounted circuit board holder structure according to claim 11, wherein
the pair of openings pass completely through the two sidewalls.

18. The vehicle-mounted circuit board holder structure according to claim 11, wherein
the pair of protrusion portions are located at a first end of the circuit board adjacent to the pair of openings.

19. The vehicle-mounted circuit board holder structure according to claim 18, wherein
the circuit board futher has a second pair of protrusion portions located at a second end of the circuit board opposite the first end, and the second pair of protrusion portions protrude in opposite directions from each other.

20. The vehicle-mounted circuit board holder structure according to claim 19, wherein each of the two sidewalls includes
an elongated protrusion that projects from an upper end of the two sidewalls to engage the second pair of protrusion portions, and
a support portion that extends underneath the circuit hoard, and
the elongated protrusion and the support portion contact the main surfaces of the circuit board opposite one another.

* * * * *